United States Patent
Prinz et al.

(10) Patent No.: US 7,491,600 B2
(45) Date of Patent: Feb. 17, 2009

(54) NANOCRYSTAL BITCELL PROCESS INTEGRATION FOR HIGH DENSITY APPLICATION

(75) Inventors: Erwin J. Prinz, Austin, TX (US); Gowrishankar L. Chindalore, Austin, TX (US); Paul A. Ingersoll, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 432 days.

(21) Appl. No.: 11/267,442

(22) Filed: Nov. 4, 2005

(65) Prior Publication Data

US 2007/0105306 A1    May 10, 2007

(51) Int. Cl.
    *H01L 21/8234* (2006.01)
    *H01L 21/8244* (2006.01)
(52) U.S. Cl. ............... 438/238; 438/381; 257/E21.245; 257/E21.267; 257/E21.304; 257/E21.314; 257/E21.645
(58) Field of Classification Search ................. 438/238, 438/381, 257, 311, 647, 657, 692, 700, 752, 438/753, 755, 706
    See application file for complete search history.

(56) References Cited

U.S. PATENT DOCUMENTS

| | | | |
|---|---|---|---|
| 5,408,115 A | 4/1995 | Chang | 257/324 |
| 5,585,293 A | 12/1996 | Sharma et al. | 437/43 |
| 5,824,584 A | 10/1998 | Chen et al. | 438/267 |
| 5,969,383 A | 10/1999 | Chang et al. | 257/316 |
| 6,060,356 A | 5/2000 | Lee | 438/257 |
| 6,468,867 B1* | 10/2002 | Lai et al. | 438/275 |
| 6,645,801 B1 | 11/2003 | Ramsbey et al. | 438/216 |
| 6,716,698 B1 | 4/2004 | He et al. | 438/257 |
| 6,730,564 B1* | 5/2004 | Ramsbey et al. | 438/258 |
| 6,897,517 B2 | 5/2005 | Van Houdt et al. | 257/315 |
| 7,223,693 B2* | 5/2007 | Choi et al. | 438/672 |
| 2002/0045315 A1 | 4/2002 | Ogura et al. | 438/257 |
| 2002/0045319 A1 | 4/2002 | Ogura et al. | 438/303 |
| 2003/0057474 A1 | 3/2003 | Ma et al. | 257/314 |

OTHER PUBLICATIONS

Palasharla, Subbarao et al.; "Complexity-Effective Superscalar Processors"; in conjunction with internship at DEC Western Research Laboratory, and grants from NSF Grant MIP-9505853, and U.S. Army Intelligence Center and Fort Huachuca Contract DABT63-95-C-0127 and ARPA Order No. D346; pp. 1-13, date unknown.

Chen, Wei-Ming et al.; "A Novel Flash Memory Device with SPlit Gate Source Side Injection and ONO Charge Storage Stack (SPIN)"; 1997 Symposium on VLSI Technology Digest of Technical Papers; pp. 63-64.

(Continued)

*Primary Examiner*—David Nhu
(74) *Attorney, Agent, or Firm*—John A. Fortkort; Fortkort & Houston P.C.

(57) ABSTRACT

A method for making a multibit non-volatile memory cell structure is provided herein. In accordance with the method, a semiconductor substrate (101) is provided, and first and second sets of memory stacks (103, 105, 107, and 109) are formed on the substrate, each memory stack including a control gate (111) and a layer of memory material (113). A source/drain region (123) is then formed between the first and second sets of memory stacks, and a silicide layer (125) is formed over the source/drain region.

24 Claims, 13 Drawing Sheets

OTHER PUBLICATIONS

Sanchez, Hector; "Design Implications of Low-K"; Advanced Circuits Development Center (AC/DC), Motorola, Austin, Texas; 3 pages.

Otsuka and Horowitz; "Circuit Techniques for 1.5-V Power Supply Flash Memory"; 1997 IEEE Journal of Solid-State Circuits; vol. 32, No. 8, Aug. 1997; pp. 1217-1230.

Chang, Kuo-Tung et al.; "A New SONOS Memory Using Source-Side Injection for Programming"; IEEE Electron Device Letters; vol. 19, No. 7, Jul. 1998; pp. 253-255.

Amrutur and Horowitz, *Fellow, IEEE*; "Fast Low-Power Decoders for RAMs"; IEEE Journal of Sollid-state Circuits; vol. 36, No. 10, Oct. 2001; pp. 1506-1515.

\* cited by examiner

NANOCRYSTAL BITCELL PROCESS INTEGRATION FOR HIGH DENSITY APPLICATION

FIELD OF THE DISCLOSURE

The present disclosure relates generally to semiconductor devices, and more particularly to multi-bit, nonvolatile memory devices and to methods for making the same.

BACKGROUND OF THE DISCLOSURE

Electrically Erasable Programmable Read Only Memory (EEPROM) permits stored data to be retained even if power to the memory is removed. An EEPROM cell stores data either by storing electrical charge in an electrically isolated floating gate of a field effect transistor (FET), or by storing electrical charge in a dielectric layer underlying a control gate of a FET. The stored electrical charge controls the threshold of the FET, thereby controlling the memory state of the EEPROM cell.

In the past, many EEPROM devices have utilized either Fowler-Nordheim tunneling or channel hot electron injection at the drain side of the memory cell for programming. However, as EEPROM devices are scaled down in size, channel hot electron injection becomes disadvantageous in that the high power needed to trigger injection becomes increasingly difficult to generate on-chip from a high voltage generator or from a charge pumping circuit. Moreover, as device sizes are scaled down, the relative area of the charge pumps and the corresponding high-voltage switching circuitry increases with respect to the useful area of the memory chip. Fowler-Nordheim tunneling, on the other hand, is limited by tunnel-oxide scaling limits and by the very high voltages needed on chip for the tunneling to occur, both of which compromise device reliability and process scalability.

Source-side hot carrier injection has emerged as a viable alternative to Fowler-Nordheim tunneling and to channel hot electron injection for EEPROM programming, particularly as device sizes are scaled down, due in part to its unique combination at moderate voltages of relatively low power consumption and high programming speed. To program an EEPROM cell using source side hot carrier injection, a select gate is formed overlying a portion of the channel region adjacent to the source region. The select gate is electrically isolated from a control gate formed adjacent to the drain region. During programming, an electric field is established in the channel region so that charge carriers originating in the source region are accelerated across the channel region before being injected into a floating gate or a dielectric layer located below the control gate. The select gate controls the channel current. Independent of the select gate, the control gate controls the vertical electric field for hot carrier injection. Thus, programming with source side hot carrier injection is more power efficient than the conventional drain side hot carrier injection, and is suitable for low voltage and low power applications.

FIGS. 1-2 illustrate one particular EEPROM device which is known to the art. The device 101 shown therein comprises a first polysilicon layer in which are defined first 103 and second 105 floating gates, and a second polysilicon layer in which are defined a control gate 107 and first 109 and second 111 program gates. The cell boundary 113 of an individual memory cell in the device is indicated by a dashed line.

FIG. 2 depicts a cross-sectional view of the EEPROM device of FIG. 1 as taken along LINE 2-2, and also indicates the conventional voltages utilized in these devices. As seen therein, the EEPROM device has a multibit non-volatile memory cell structure comprising (a) a semiconductor substrate 113 of a first conductivity type, (b) first 115 and a second 117 junction regions which are of a second conductivity type and which form a part of a first and a second bitline, (c) first 103 and second 105 floating gates, and (d) a control gate 107 which is part of a wordline running perpendicular to said first and second bitline. The read, write and erase functions for each cell in this device utilize two polysilicon layers, and each memory cell has two locations for storing a charge representing at least one bit.

While devices of the type shown in FIG. 1 have certain notable advantages, they also suffer from certain infirmities. In particular, the fabrication processes currently known to the art for making such devices are not commercially feasible. Also, devices of the type shown in FIG. 1 are found to have high wordline and bitline sheet resistances. There is thus a need in the art for a fabrication process that overcomes these infirmities. There is also a need in the art for a nonvolatile memory device that exhibits lower wordline and bitline sheet resistances. These and other needs may be met by the devices and methodologies described herein.

DETAILED DESCRIPTION

Figure 1:
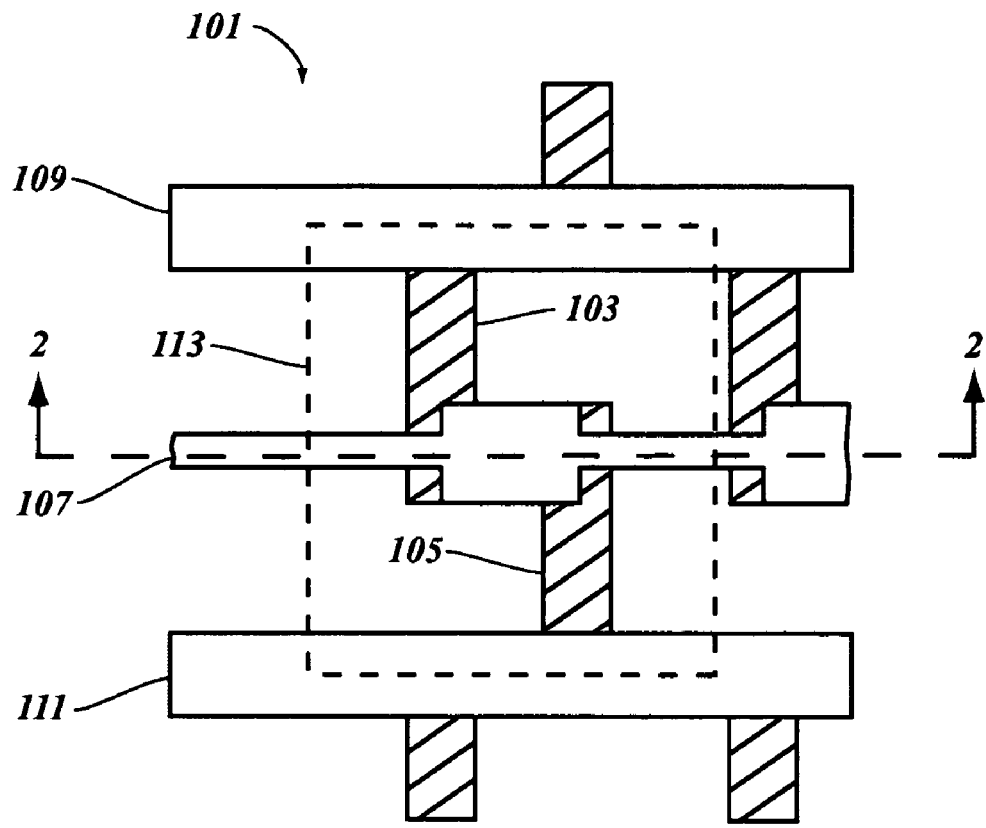
FIG. 1 is an illustration of a memory array for source-side injection into dual floating gates.

In one aspect, a method for making a nonvolatile memory is provided. In accordance with the method, a semiconductor substrate is provided, and first and second sets of memory stacks are formed on the substrate, each memory stack comprising a control gate and a layer of a data storage material. An implant region is formed in the substrate between the first and second sets of memory stacks, and a silicide layer is formed over the implant region.

In another aspect, a nonvolatile memory device is provided which comprises (a) a semiconductor substrate; (b) first and second sets of memory stacks disposed on the substrate, each memory stack comprising a control gate and a layer of a data storage material; (c) an implant region disposed between the first and second sets of memory stacks; and (d) a silicide layer disposed over the implant region.

In still another aspect, a method for making a non-volatile memory device is provided. In accordance with the method, a substrate is provided, a layer of a data storage material is formed on the substrate, and a gate material is deposited over the layer of data storage material. A photoresist etch mask is formed over the gate material, and the gate material is etched so as to define a plurality of gates therein.

In yet another aspect, a method for making a non-volatile memory device is provided herein. In accordance with the method, a semiconductor substrate is provided, and a data storage layer is formed on the substrate. A layer of gate material is formed over the data storage layer, and a trench is created which extends through the layer of gate material and the data storage layer. Spacer structures are then formed in the trench such that a portion of the substrate is exposed between the spacer structures, and an implant region is created between the spacer structures.

These and other aspects of the present disclosure are described in greater detail below.

As explained in greater detail below, the methods for making high density nonvolatile memory devices (such as EEPROM devices) that have currently been developed in the art and that utilize source side injection for programming rely on the use of spacer structures to define the control gates or floating gates of those devices. It has been found that this approach is not scalable, because the spacer dimensions (and hence the gate dimensions) in devices made in accordance with this process become increasingly difficult to control in a reproducible manner as device sizes shrink. Hence, at applications of 90 nm or below, the performance characteristics of nonvolatile memory devices made by this process vary so much that the process is not commercially feasible.

It has now been found that this problem may be overcome through the use of a fabrication process for making EEPROM memory devices that relies on photolithographic techniques, rather than the use of spacer structures, to define the control gates or floating gates of the device. Since this approach has a much lower level of dimensional variation associated with it, extremely dense memory devices can be made by this process in a highly reproducible and scalable manner. This approach is especially useful with 90 nm technologies and below since, at these dimensions, patternable features and overlays are much more highly reproducible than spacer structures.

It has also been found that the problem with high sheet resistance in prior art EEPROM devices can be overcome through the use of a fabrication process that includes (and permits) silicidation of the gate structures and/or the implant regions that define the bitlines of the device. Such silicidation significantly improves the speed of the device by reducing the resistance across these features, while also reducing the current/voltage requirements of the device.

Finally, it has been found that the spacing between control gates or floating gates formed over a substrate in a nonvolatile memory device can be effectively utilized as a means for selectively forming implant regions in the substrate between alternating pairs or sets of control gates or floating gates so as to form two-bit or multi-bit memory cells. This may be accomplished by increasing the spacing between adjacent sets of control gates (or floating gates) relative to the spacing between the individual gates within a set. If the ratio of these two spacings are within a certain range for a given thickness of the layer of spacer material, then when the spacer material is deposited over the gates and is etched back to form the spacer structures for the implant between the sets of control gates (or floating gates), the spacer material will completely cover the portion of the substrate between the individual gates within a set.

Figure 2:
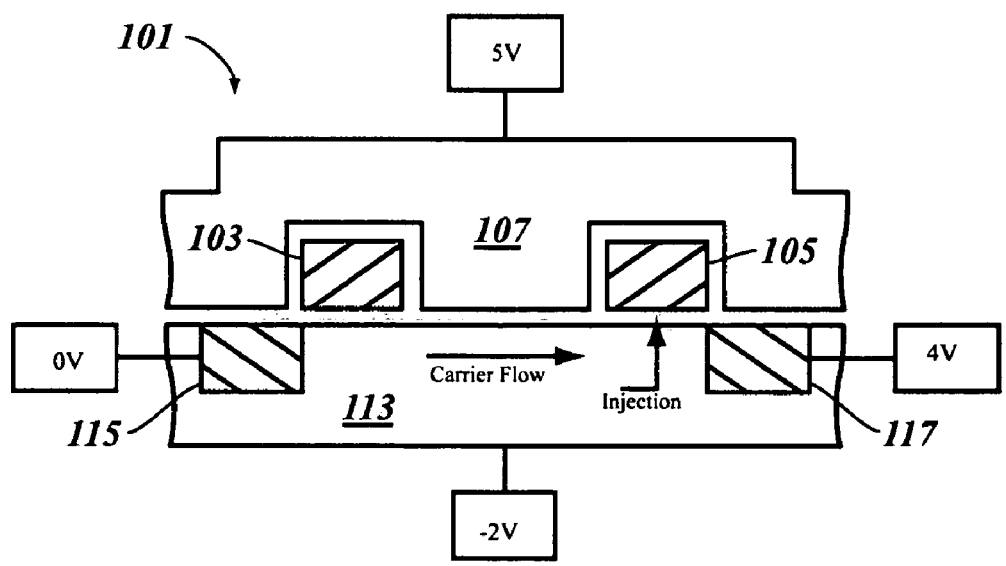
FIG. 2 is a cross-sectional illustration of the device of FIG. 1 taken along LINE 2-2 showing typical voltages for source-side injection programming

The methodologies disclosed herein may be further understood by first considering the infirmities of the prior art process disclosed in FIGS. 3-7. This process has been used to make devices such as that shown in FIGS. 1-2.

Figure 3:
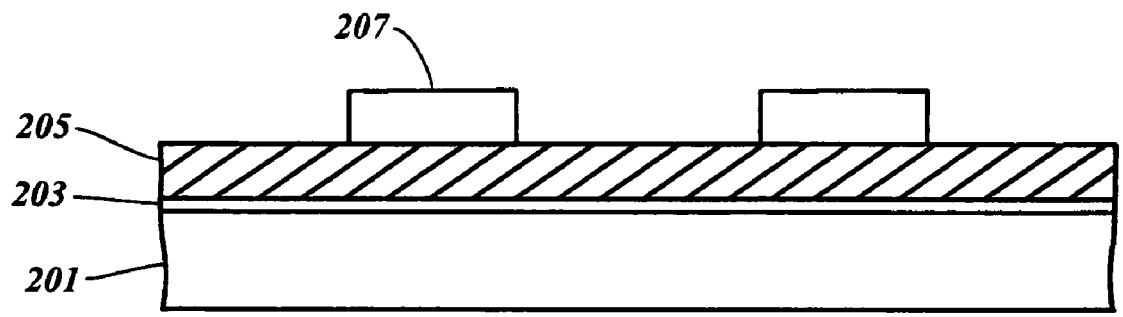
FIG. 3 is a cross-sectional illustration depicting a step in a prior art process for making a memory device.

As shown in FIG. 3, the process commences with a structure comprising a substrate 201, a dielectric layer 203, and a first polysilicon layer 205. A first hard mask 207 is then formed on top of the first polysilicon layer 205 through the deposition and patterning of a suitable hard mask material. The first hard mask 207 is patterned as a series of stripes which are oriented parallel to the bitline direction of the device (that is, the direction perpendicular to the plane of the cross-section shown in FIG. 3).

Figure 4:
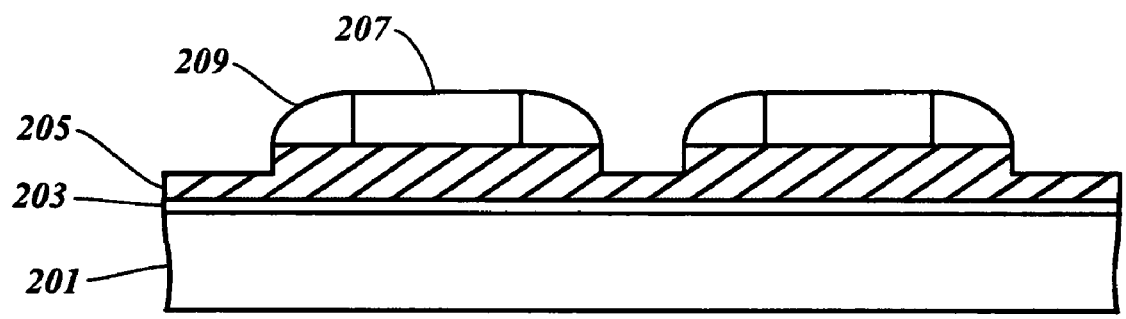
FIG. 4 is a cross-sectional illustration depicting a step in a prior art process for making a memory device.

As shown in FIG. 4, a second hard mask material is then deposited and is etched back in order to create spacer structures 209 which are adjacent to, and along, the first hard mask 207. This is followed by a self-aligned etch of the first polysilicon layer 205. The second hard mask material differs in composition from the first hard mask material so as to allow selective anistropic etching of the second hard mask material.

Figure 5:
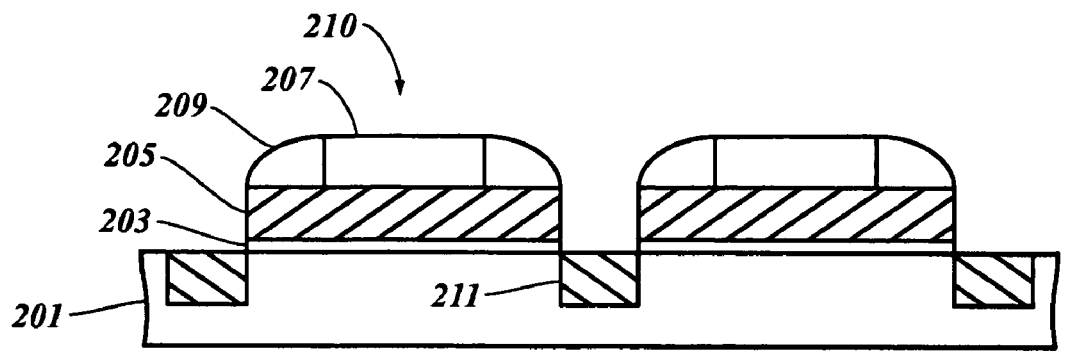
FIG. 5 is a cross-sectional illustration depicting a step in a prior art process for making a memory device.

As shown in FIG. 5, the first polysilicon layer 205 is then selectively etched so as to outline the memory cell 210. A series of implant regions 211 are then implanted in the substrate 201 to form the bitlines of the structure. These implant regions 211 are self-aligned to the patterned first polysilicon layer 205 and are positioned such that they are shared between neighboring memory stacks 213 (see FIGS. 6-7).

Figure 6:
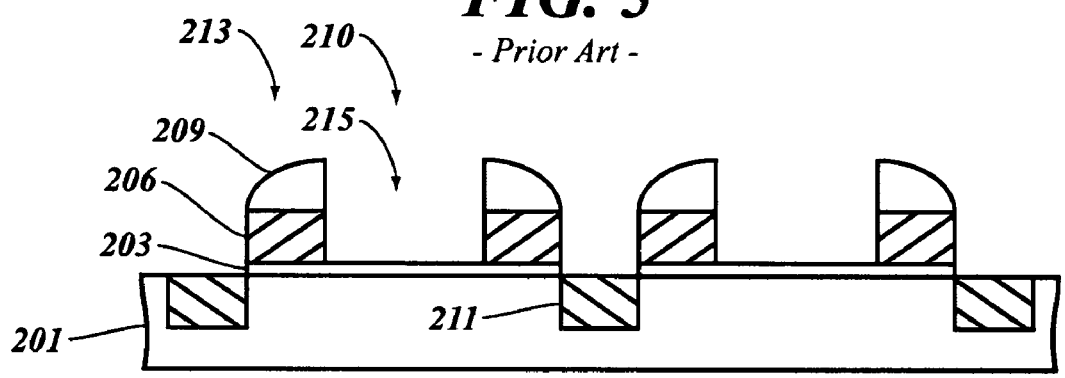
FIG. 6 is a cross-sectional illustration depicting a step in a prior art process for making a memory device.

Next, as shown in FIG. 6, the first hard mask 207 (see FIG. 5) is removed through etching to expose the underlying first polysilicon layer 205. The exposed portion of the first polysilicon layer 205 is then removed by an etch which is self-aligned to the spacer structures 209, thereby creating floating gates 206 which are located one on each side of the memory cell 210. Notably, the width of the second hard mask spacers 209 defines the width of the underlying floating gates 206. This etch also creates a cavity 215 which defines the channel region of the select gate or wordline 217 which is formed in subsequent processing steps (see FIG. 7).

Figure 7:
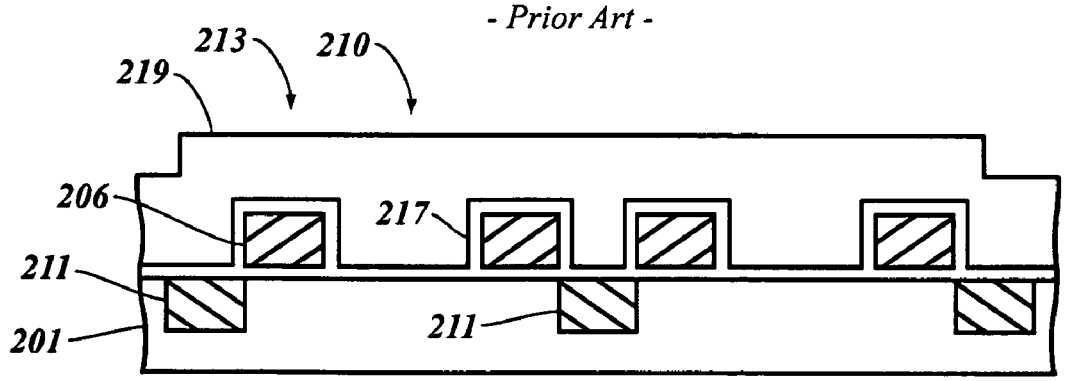
FIG. 7 is a cross-sectional illustration depicting a step in a prior art process for making a memory device.

Next, as shown in FIG. 7, the spacers formed in the second hard mask layer 209 are removed, and a dielectric layer 217 is grown over the structure which covers the floating gates 206 and the substrate 201. Subsequently, a select gate 219 is formed by depositing and patterning a second layer of polysilicon on top of the dielectric layer 217 to form the wordline of the dual-bit floating gate structure. The select gate 219 is formed in a self-aligned manner so that the wordline is substantially perpendicular to the bitlines 211. A last step results in isolation of the memory cells 213. The array is finalized by providing a p$^+$ implant (not shown) in the exposed substrate in between the wordlines 219 for electrically isolating the individual cells 213, thereby realizing a field-less isolation area between these wordlines 219.

As previously noted, the preceding process for forming an EEPROM flash memory device has some notable limitations which render it commercially unfeasible at reduced device sizes. In particular, this process relies on the use of hard mask spacers 209 (see FIG. 6) to define the memory cells and, in particular, the floating gates thereof. These spacers are created by etching processes. Consequently, the final dimensions of these spacers (and their respective floating gates) are very sensitive to variations in the process parameters of the etch that is used to create them. At smaller dimensions, these process variations result in dimensional variations that, as a percentage of total gate length, are considerable. Therefore, the desired spacer dimensions are not reproducible as device sizes are scaled down, especially to 90 nm technologies and below. At these device sizes, the aforementioned dimensional variations cause significant differences in the efficiency of the erase operation from one bit cell to another, thus resulting in a marked deterioration in overall device performance.

The aforementioned problems with the reproducibility of control gate dimensions in the process described in FIGS. 3-7 are addressed by the methodologies disclosed herein, which may be understood with respect to the first specific, non-limiting embodiment depicted in FIGS. 8-19.

Figure 8:
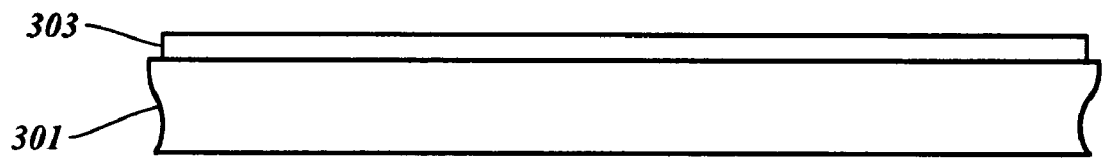
FIG. 8 is a cross-sectional illustration depicting a step in a first embodiment of a process for making a memory device in accordance with the teachings herein.

With reference to FIG. 8, a substrate 301 is provided upon which is disposed a layer of dielectric material 303. The substrate may be, for example, a bulk semiconductor wafer or a semiconductor-on-insulator (SOI) wafer. The dielectric material is preferably silicon oxide, but may also be SiON or other suitable materials.

Figure 9:
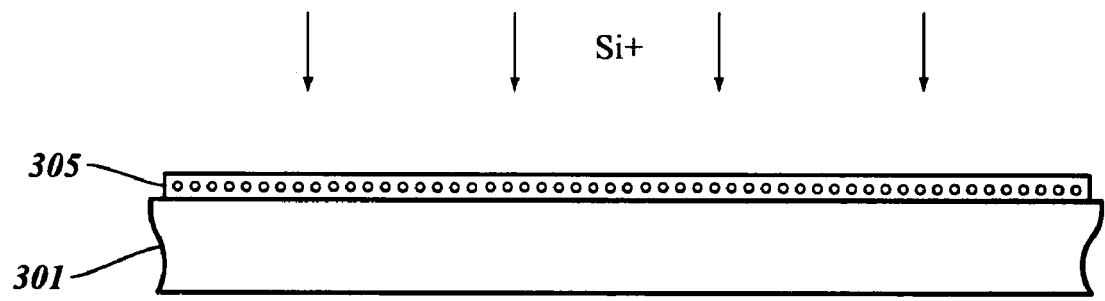
FIG. 9 is a cross-sectional illustration depicting a step in a first embodiment of a process for making a memory device in accordance with the teachings herein.

As shown in FIG. 9, a data storage layer 305 is formed in the dielectric layer 303 by subjecting it to ion implantation with $Si^+$, $Ge^+$, or another suitable ion source, which in some embodiments may be followed by a high temperature anneal. The resulting data storage layer 305 comprises a layer of semiconductor nanocrystal material that is sandwiched between layers of the dielectric material 303 and that can be electronically programmed to store a charge. Alternatively, the data storage layer 305 can be formed by growing a bottom oxide layer on a substrate, forming nanocrystals on the bottom oxide layer through chemical vapor deposition, and depositing a top oxide layer over the nanocrystals.

Although other data storage materials and techniques can be used in practicing the methodologies described herein (including the use of floating gates), the use of nanocrystal charge store materials in the data storage layer 305 has a number of advantages. Due to the discontinuous nature of the nanocrystal charge storage material, a data storage layer 305 incorporating this material does not exhibit vulnerability to isolated defect paths in the underlying component dielectric material, the later of which is utilized as the gate oxide in the particular embodiment illustrated. Thus, the gate oxide under the nanocrystal charge storage layer can be scaled down, reducing the voltage needed for program/erase operations. The nanocrystal bitcell can be erased to an almost charge-neutral state using Fowler-Nordheim tunneling induced by a vertical field. The erase operation is independent of the length of the charge storage region under the control gate. The structure can also be used to implement storage cells that utilize either a multi-level cell (MLC) or two physically different storage areas (as in the NROM bitcell in which a SONOS charge storage dielectric is used) to pack two bits in each cell. Furthermore, memory cells based on nanocrystal charge storage materials are smaller than conventional floating-gate structures. The nanocrystal technology is also a relatively simple extension to standard CMOS processes, requiring only a few additional mask steps. Consequently, it may be used to fabricate low-cost chips that combine logic and non-volatile memory.

Figure 10:
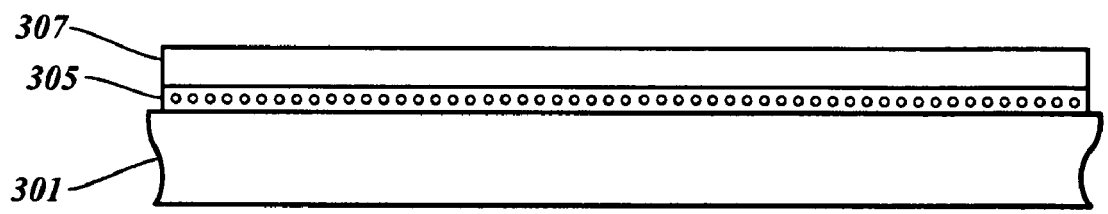
FIG. 10 is a cross-sectional illustration depicting a step in a first embodiment of a process for making a memory device in accordance with the teachings herein.

Referring now to FIG. 10, a layer of conductive material 307 is disposed over the data storage layer 305. The layer of conductive material 307, from which the control gates of the structure are subsequently formed, may comprise polysilicon, metals, or various other suitable conductive materials as are known to the art.

Figure 11:
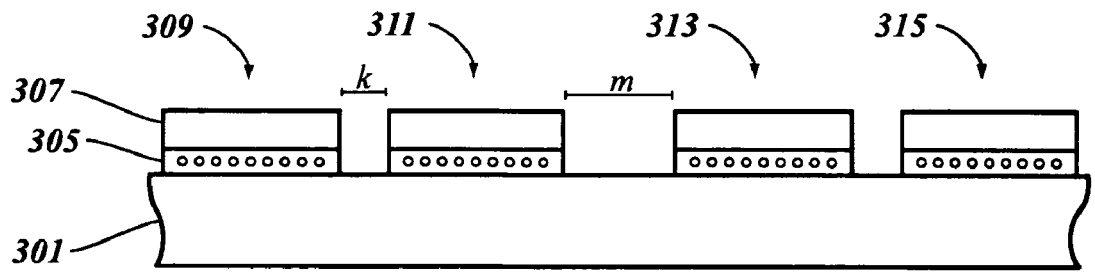
FIG. 11 is a cross-sectional illustration depicting a step in a first embodiment of a process for making a memory device in accordance with the teachings herein.
Figure 12:
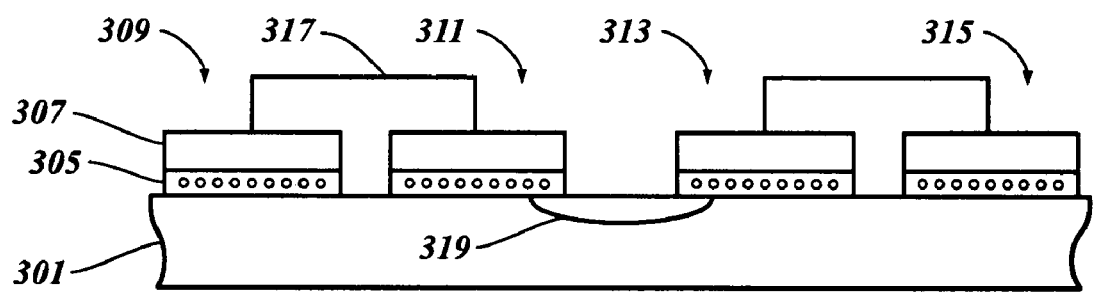
FIG. 12 is a cross-sectional illustration depicting a step in a first embodiment of a process for making a memory device in accordance with the teachings herein.

With reference to FIG. 11, the data storage layer 305 and the layer of conductive material 307 are patterned through suitable masking and etching steps to create memory stacks 309, 311, 313 and 315. Then, as shown in FIG. 12, a layer of photoresist 317 is deposited over the structure and is patterned such that the space between memory stacks 309 and 311, and the space between memory stacks 313 and 315, is covered, while the space between memory stacks 311 and 313 is exposed. This is followed by implantation of an N extension region 319 in the substrate exposed between memory stacks 311 and 313. The layer of photoresist 317 is then stripped.

Figure 13:
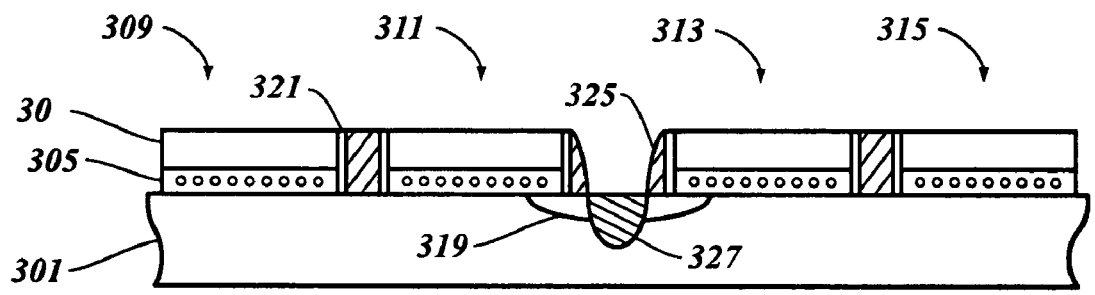
FIG. 13 is a cross-sectional illustration depicting a step in a first embodiment of a process for making a memory device in accordance with the teachings herein.

With reference to FIG. 13, a liner layer 321, which preferably comprises deposited oxide (TEOS), is formed over the structure and is anisotropically etched back to create a liner in each of the trenches in the structure. Subsequently, a spacer material 325 is deposited over the structure and is etched back anisotropically. This has the effect of backfilling the trenches between memory stacks 309 and 311 and between memory stacks 313 and 315, and also causes the formation of spacer structures 325 between memory stacks 311 and 313. A deep implant source/drain $N^+$ region 327 is then formed between the spacer structures 325. The source/drain region 327 defines the bitlines of the device.

Figure 14:
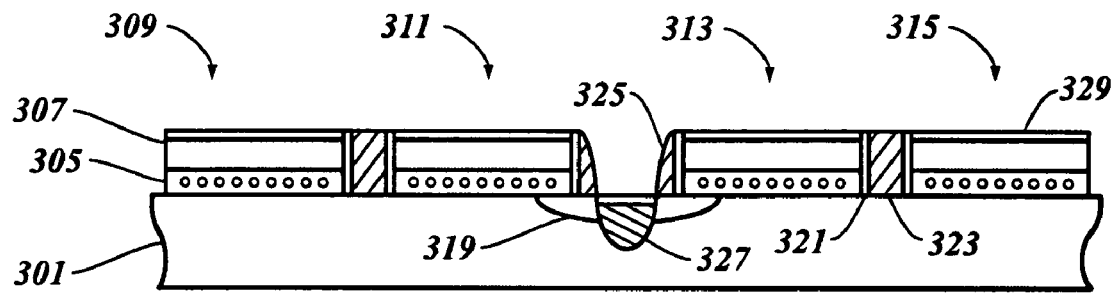
FIG. 14 is a cross-sectional illustration depicting a step in a first embodiment of a process for making a memory device in accordance with the teachings herein.

The structure is then subjected to silicidation as shown in FIG. 14 to form a layer of silicide 329 over deep implant region 327 and over each of memory stacks 309, 311, 313 and 315. In embodiments in which the conductive material 307 (from which the control gates of the structure are formed) is a metal, silicidation of this layer may be omitted, although it is still preferred, in such embodiments, to form a layer of silicide 329 over the deep implant region 327.

Figure 15:
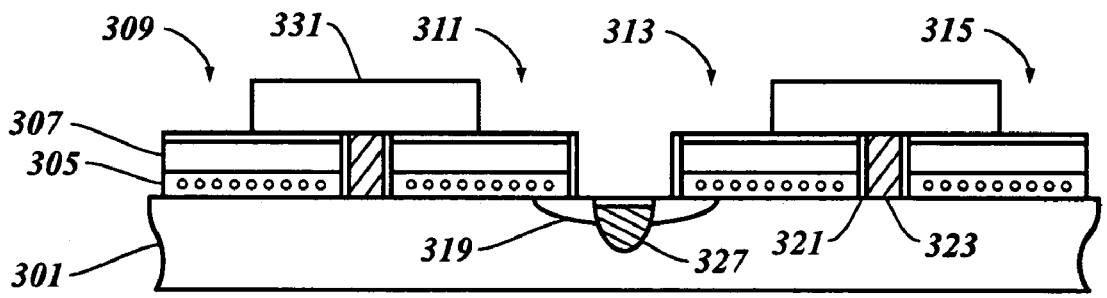
FIG. 15 is a cross-sectional illustration depicting a step in a first embodiment of a process for making a memory device in accordance with the teachings herein.

As shown in FIG. 15, a second layer of photoresist 331 is then deposited over the structure and is patterned to expose the region between memory stacks 311 and 313, after which the spacer structures 325 (see FIG. 14) are removed with a suitable etch. Preferably, the etch is a dry nitride etch. The second layer of photoresist 331 is subsequently stripped.

Figure 16:
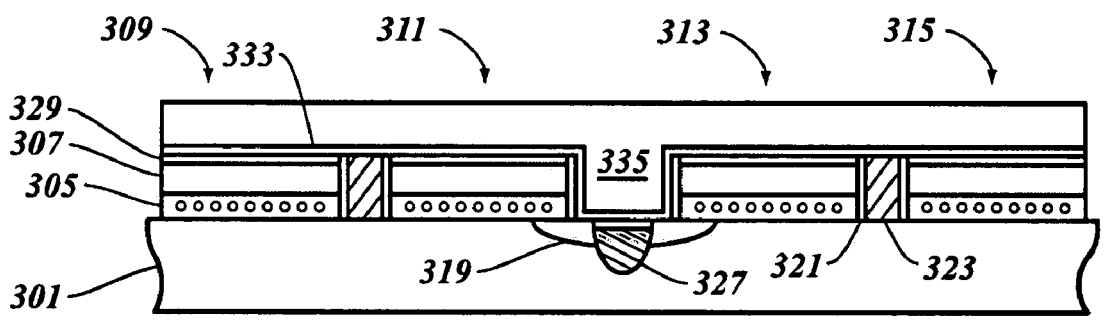
FIG. 16 is a cross-sectional illustration depicting a step in a first embodiment of a process for making a memory device in accordance with the teachings herein.
Figure 17:
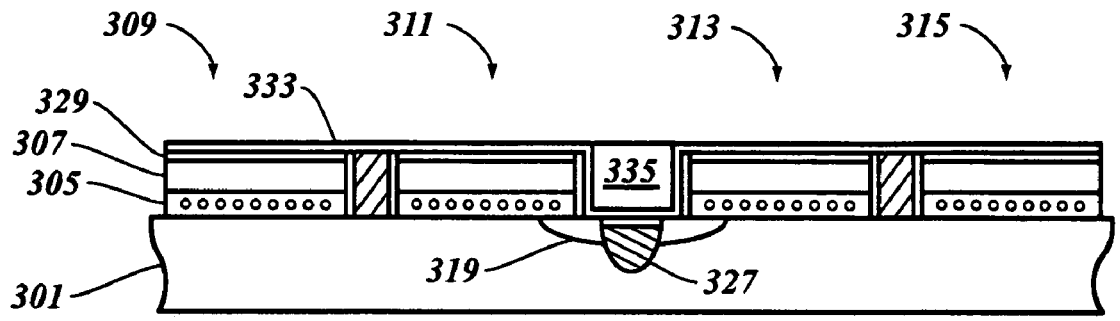
FIG. 17 is a cross-sectional illustration depicting a step in a first embodiment of a process for making a memory device in accordance with the teachings herein.

Referring now to FIG. 16, a layer of nitride 333 is deposited over the structure as a polish stop layer, followed by a layer of high temperature oxide 335. The high temperature oxide 335 is preferably silicon oxide. The structure is then subjected to an oxide polish, which will preferably involve using chemical mechanical polishing (CMP) to reduce the thickness of the high temperature oxide layer 335 down to the polish stop layer 333. The effect of the high temperature oxide deposition and polishing is to backfill the trench between memory stacks 311 and 313 with the high temperature oxide 335, as shown in FIG. 17.

Figure 18:
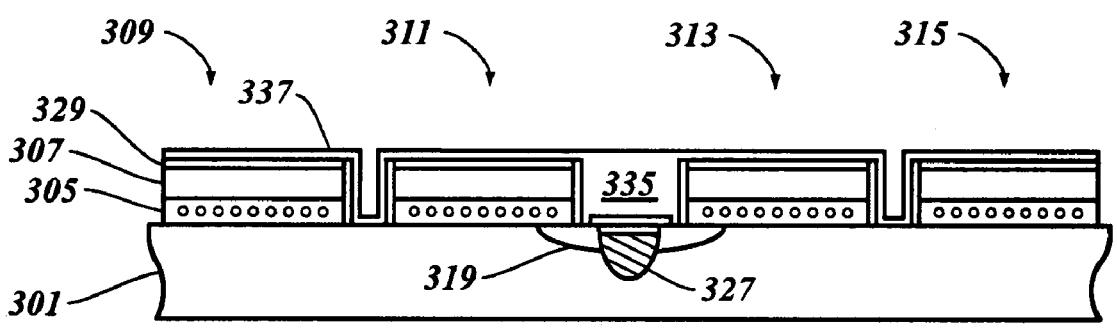
FIG. 18 is a cross-sectional illustration depicting a step in a first embodiment of a process for making a memory device in accordance with the teachings herein.
Figure 19:
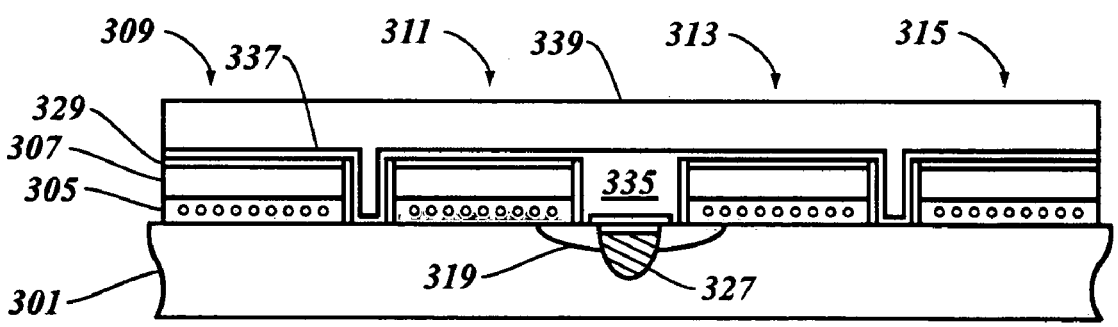
FIG. 19 is a cross-sectional illustration depicting a step in a first embodiment of a process for making a memory device in accordance with the teachings herein.

Referring now to FIG. 18, the polish stop layer 333 is removed with a suitable etch, followed by deposition of a gap oxide 337. The thickness of the gap oxide layer 337 will typically be about 100 Å, but may vary somewhat depending on the particular device being fabricated. The gap oxide may be, for example, silicon oxide. Finally, a select gate 339 is formed by depositing a suitable gate material over the structure as shown in FIG. 19, and patterning the gate material appropriately.

The select gate 339 preferably comprises a metal, since the temperature for the post-silicidation process is preferably kept below 850° C. If polysilicon is used as the select gate material, dopant activation in the polysilicon may be achieved in a two-step process, with a first phase change at 650° C. immediately after the deposition of cobalt on the control gate and the $N^+$ implant region, and a final anneal near 850° C. after formation of the select gate 339 to activate the dopants to a suitable level.

The process depicted in FIGS. 8-19 has a number of benefits over the prior art process depicted in FIGS. 3-7. In particular, as previously noted, the prior art process depicted in FIGS. 3-7 relies on the use of hard mask spacers 209 (see FIG. 6) to define the memory cells, and in particular, the floating gates thereof, with all of the drawbacks attendant to that process as have been previously noted. By contrast, in the process depicted in FIGS. 8-19, the dimensions of the control gates are defined by photolithography (and in particular, by the use of a photoresist mask in conjunction with etching). This process provides significantly greater control over gate dimensions, especially at device sizes of 90 nm or less, and hence is much more scalable. Consequently, nonvolatile memory devices can be made by this process with much less variability in control gate dimensions and device performance, and therefore with much greater reproducibility. The use of control gates in conjunction with a nanocrystal storage material to store electrical charge is also superior to the use in the prior art process of floating gates in conjunction with a gate dielectric, due to the advantages of the nanocrystal materials as have been previously noted.

Another benefit of the process depicted in FIGS. 8-19 is that this process provides for the silicidation of both the implant region 327 and the gate structures 307. As has been previously noted, prior art EEPROM devices suffer from high sheet resistance. By contrast, in devices made in accordance with the process depicted in FIGS. 8-19, silicidation significantly improves the speed of the device by reducing the resistance across these features, while also reducing the current/voltage requirements of the device. Such silicidation is not possible in the prior art process depicted in FIGS. 3-7, because the implant regions 211 are self-aligned to the control gates 206 (see FIG. 6). Hence, silicidation would short out the device. By contrast, in the process depicted in FIGS. 8-19, the spacer structures 325 that are used to define the implant regions 327 and that are present during silicidation inherently create a gap between the layer of silicide that extends over the implant region and the adjacent control gates (see, e.g., FIGS. 14-15). Hence, silicidation is possible without shorting out the device.

A further advantage of the process depicted in FIGS. 8-19 relates to the relative spacing between control gates. In particular, and as best seen in FIG. 11, the spacing between memory stacks 309 and 311 (the first set of memory stacks) and the spacing between memory stacks 313 and 315 (the second set of memory stacks) is small relative to the spacing between memory stacks 311 and 313 (that is, the spacing between adjacent sets of memory stacks). Consequently, and as seen in FIG. 13, the deposition and anisotropic etch of the spacer material results in formation of spacer structures 325 between the first and second sets of control gates, but completely backfills the space between memory stacks 309 and 311 and between memory stacks 313 and 315. This permits the spacer material to effectively serve as an implant mask so that implant regions are formed only between the first and second sets of memory stacks, as is necessary for the formation of two-bit memory cells. A similar approach could be used more generally to create multi-bit memory cells.

While the optimum spacing between the first and second sets of memory stacks relative to the spacing between memory stacks within a set can vary, typically, if w is the thickness of the spacer material, k is the spacing between memory stacks within a set, and m is the spacing between adjacent sets of memory stacks, then the relation between w, k and m is given by EQUATION 1:

$$\tfrac{1}{2}m > w > \tfrac{1}{2}k > 0 \quad \text{(EQUATION 1)}$$

A number of variations are possible in the previously described process. Some of these variations are apparent with reference to FIGS. 20-28, which illustrate a second specific, non-limiting embodiment of a method for making a nonvolatile memory device in accordance with the teachings herein.

Figure 20:
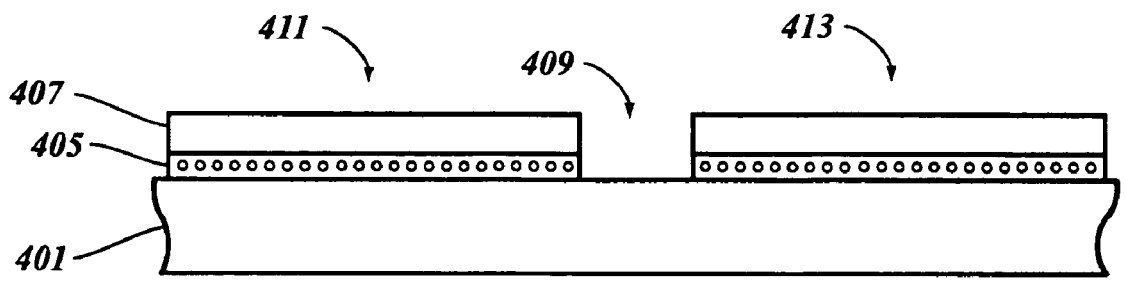
FIG. 20 is a cross-sectional illustration depicting a step in a second embodiment of a process for making a memory device in accordance with the teachings herein.

Using processing steps similar to those depicted in FIGS. 8-10, as shown in FIG. 20. a structure is created which comprises a substrate 401 having a data storage layer 405 disposed thereon, and having a layer of conductive material 407 disposed over the data storage layer 405. The materials of the data storage layer 405 and the conductive material 407 are as described in the previous embodiment. A trench 409 is created in the structure which divides the data storage layer 405 and the conductive material 407 into first 411 and second 413 stacks.

Figure 21:
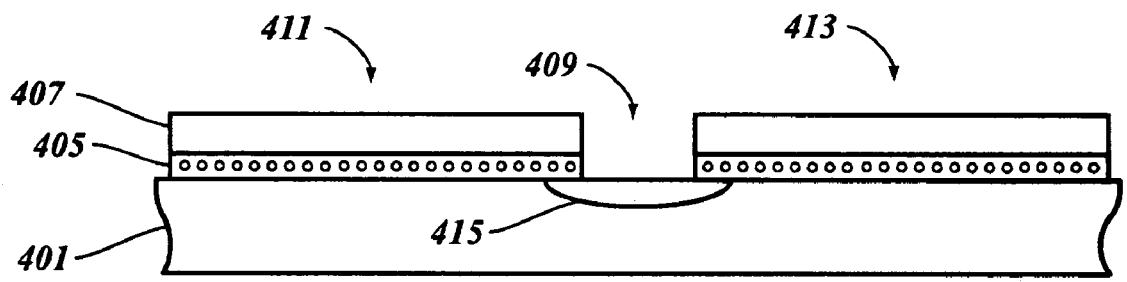
FIG. 21 is a cross-sectional illustration depicting a step in a second embodiment of a process for making a memory device in accordance with the teachings herein.

As shown in FIG. 21, an N extension region 415 is implanted in the substrate 401. In contrast to the method illustrated in FIGS. 8-19, the need for depositing, patterning, and subsequently stripping a layer of photoresist is avoided in the implantation step here, since the first 411 and second 413 stacks have not yet been patterned into individual memory stacks. Hence, the first 411 and second 413 stacks themselves serve as an implantation mask.

Figure 22:
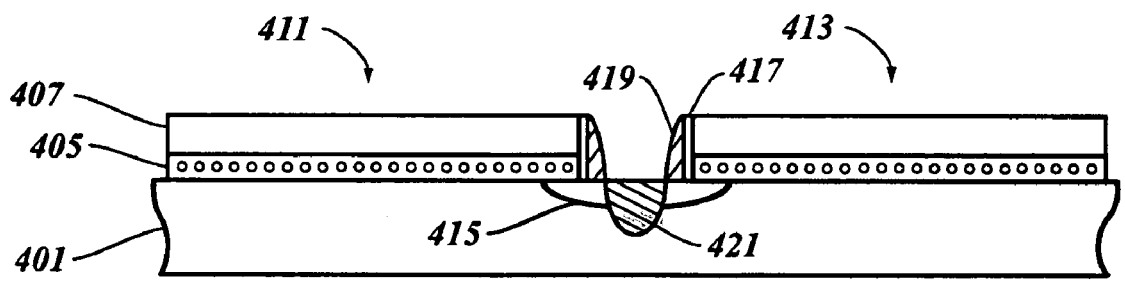
FIG. 22 is a cross-sectional illustration depicting a step in a second embodiment of a process for making a memory device in accordance with the teachings herein.

Referring now to FIG. 22, a liner layer 417, which preferably comprises a deposited oxide (TEOS), is deposited over the structure and is etched back to create a liner over the vertical surfaces of the trench 409 in the structure. Subsequently, a spacer material is deposited over the structure and is etched anisotropically to form spacer structures 419 between first 411 and second 413 stacks. A deep implant source/drain $N^+$ region 421 is then formed between the spacer structures 419. The source/drain region 421 defines the bitlines of the device.

Figure 23:
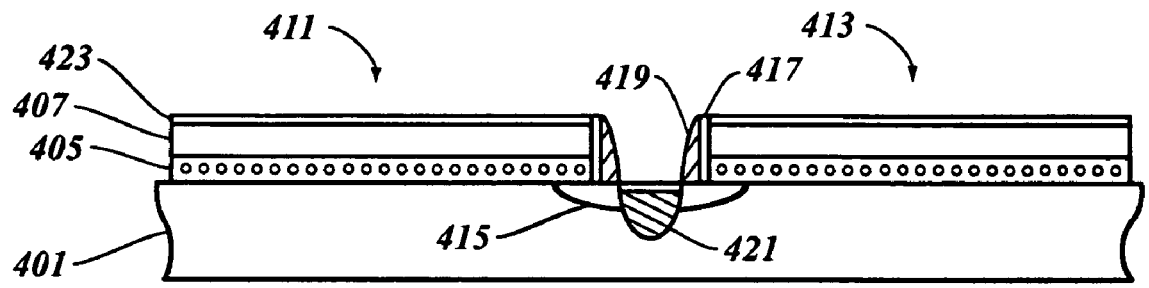
FIG. 23 is a cross-sectional illustration depicting a step in a second embodiment of a process for making a memory device in accordance with the teachings herein.
Figure 24:
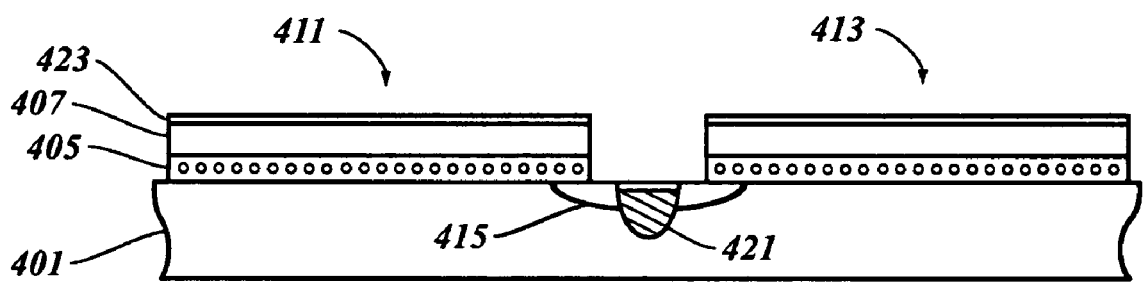
FIG. 24 is a cross-sectional illustration depicting a step in a second embodiment of a process for making a memory device in accordance with the teachings herein.

With reference to FIG. 23, the structure is then subjected to silicidation to form a layer of silicide 423 over source/drain region 421 and over the first 411 and second 413 stacks. In embodiments in which the conductive material 407 (from which the control gates of the structure are subsequently formed) is a metal, silicidation of this layer is preferably omitted, although it is still preferred, in such embodiments, to form a layer of silicide 423 over the source/drain region 421. The spacer structures 419 (see FIG. 23) and the liner layer 417 are then removed with a suitable etch as shown in FIG. 24.

Figure 25:
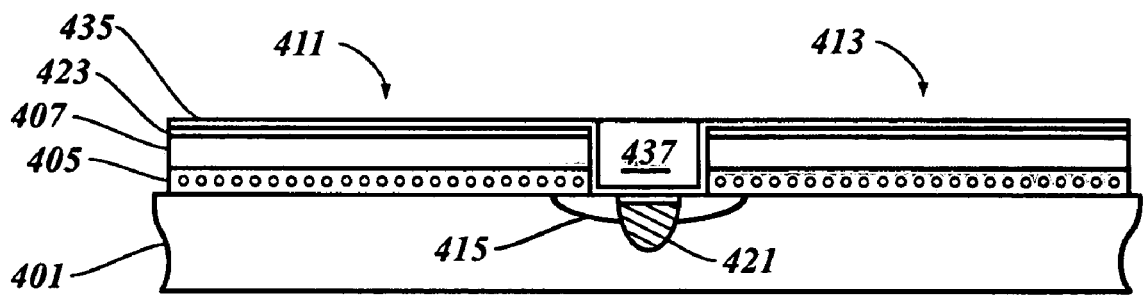
FIG. 25 is a cross-sectional illustration depicting a step in a second embodiment of a process for making a memory device in accordance with the teachings herein.

With reference to FIG. 25, a layer of nitride 435 is then deposited over the structure, followed by a layer of high temperature oxide 437. The high temperature oxide 437 is preferably silicon oxide. The structure is then subjected to an oxide polish, which will preferably involve using chemical mechanical polishing (CMP) to reduce the thickness of the high temperature oxide layer 437 down to the layer of nitride 435. The effect of the high temperature oxide deposition and polishing is to backfill the trench between memory stacks 429 and 431 with the high temperature oxide 437.

Figure 26:
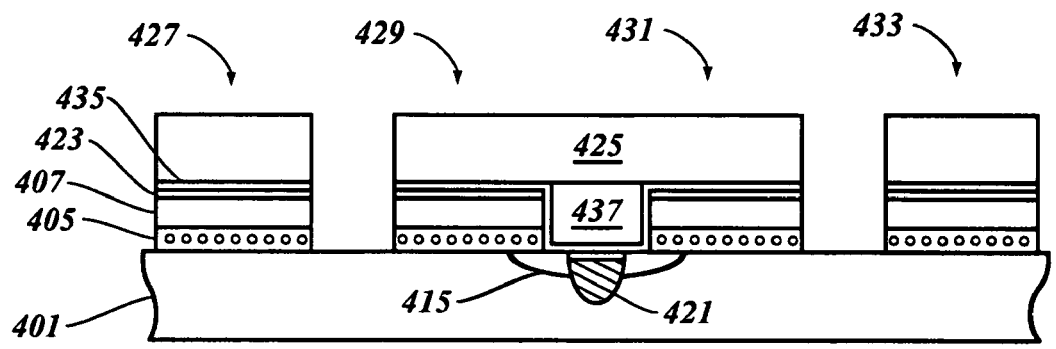
FIG. 26 is a cross-sectional illustration depicting a step in a second embodiment of a process for making a memory device in accordance with the teachings herein.
Figure 27:
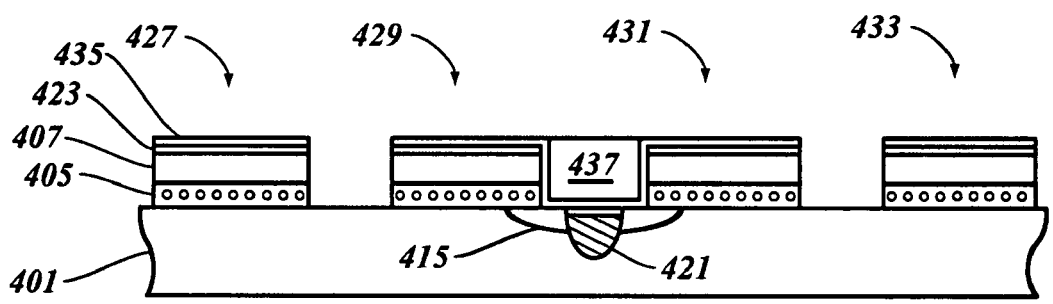
FIG. 27 is a cross-sectional illustration depicting a step in a second embodiment of a process for making a memory device in accordance with the teachings herein.

With reference to FIG. 26, a layer of photoresist 425 is then deposited over the structure and is patterned to expose a portion of stacks 411 and 413. Stacks 411 and 413 are then etched down to the substrate so as to create individual memory stacks 427, 429, 431 and 433. The layer of photoresist 425 is then stripped as shown in FIG. 27.

Figure 28:
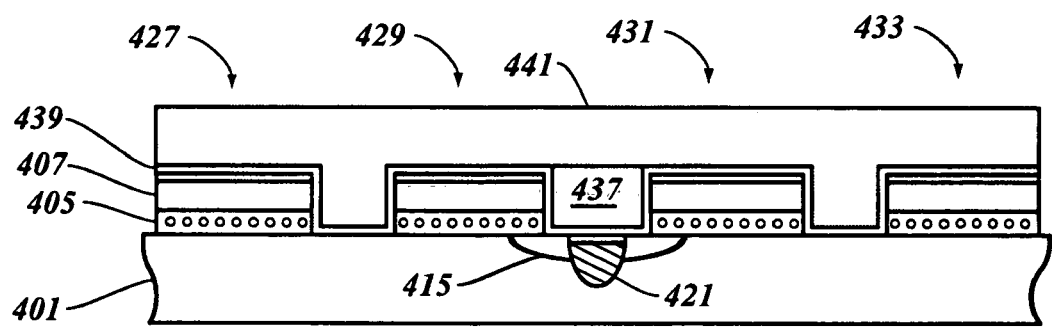
FIG. 28 is a cross-sectional illustration depicting a step in a second embodiment of a process for making a memory device in accordance with the teachings herein.

Referring now to FIG. 28, the layer of nitride 435 (see FIG. 27) is removed with a suitable etch, followed by deposition of a gap oxide 439. The thickness of the gap oxide layer 439 will typically be about 100 Å, but may vary somewhat depending on the particular device being fabricated. Finally, a select gate 441 is formed by depositing a suitable gate material over the structure as shown in FIG. 28, and by patterning the gate material appropriately.

The process depicted in FIGS. 20-28 is advantageous over the process depicted in FIGS. 8-19 in that it avoids some of the processing steps in the former. For example, by delaying the definition of the individual memory stacks 427, 429, 431 and 433 (see FIG. 26) to a point later in the fabrication process, the need for an implant mask between memory stacks 427 and 429 and between memory stacks 431 and 433 is avoided, since the source/drain region is defined prior to the formation of the individual memory stacks. Moreover, the relative spacing between the memory stacks is less important, because it is not relied upon to form a mask for the implantation process. On the other hand, the process of FIGS. 8-19 is advantageous over the process depicted in FIGS. 20-28 in that the memory stacks 427, 429, 431 and 433 are defined in a single mask/etch process, so there are no alignment issues between the etch used to define the trench for source/drain implantation and the subsequent etch used to define the individual memory stacks 427, 429, 431 and 433.

Figure 29:
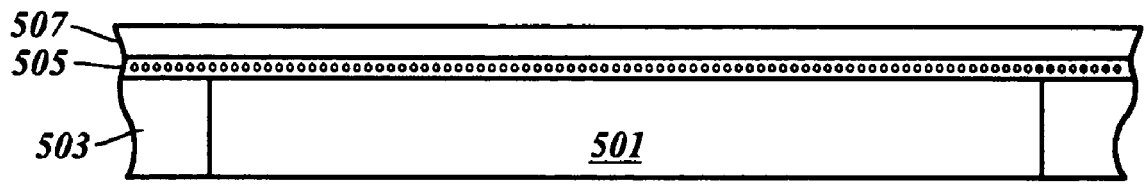
FIG. 29 is a cross-sectional illustration depicting a step in a third embodiment of a process for making a memory device in accordance with the teachings herein.
Figure 30:
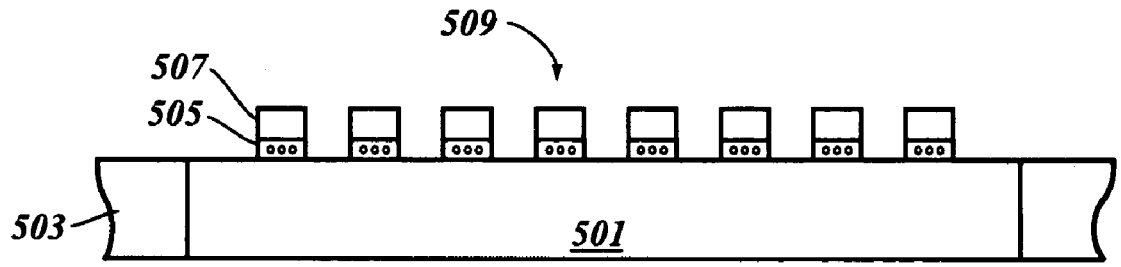
FIG. 30 is a cross-sectional illustration depicting a step in a third embodiment of a process for making a memory device in accordance with the teachings herein.
Figure 31:
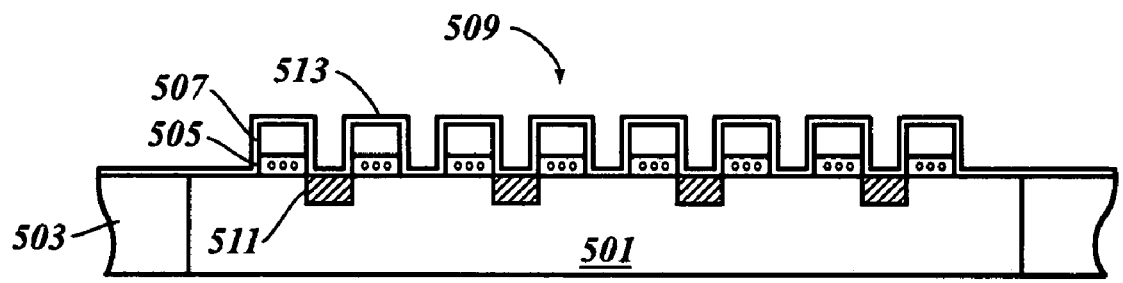
FIG. 31 is a cross-sectional illustration depicting a step in a third embodiment of a process for making a memory device in accordance with the teachings herein.

FIGS. 29-31 illustrate a third specific, non-limiting embodiment of the methodologies described herein. With reference to FIG. 29, a substrate 501 is provided which is equipped with a trench isolation structure 503. The trench isolation structure 503 serves to electrically isolate a region of the substrate from adjoining regions. A data storage layer 505 and conductive layer 507, which may comprise the same materials as their counterparts in the previously described embodiments, are disposed on the substrate 501.

Figure 32:
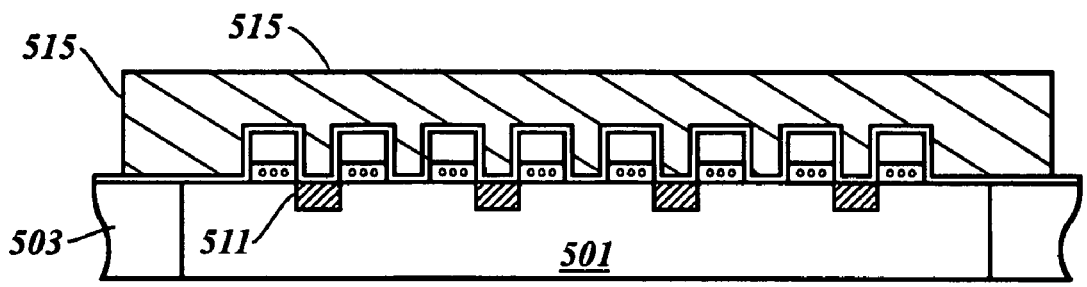
FIG. 32 is a cross-sectional illustration depicting a step in a third embodiment of a process for making a memory device in accordance with the teachings herein.

As shown in FIG. 30, the data storage layer 505 and conductive layer 507 are etched using suitable photolithographic processes so as to create a series of memory stacks 509. Next, as shown in FIG. 31, a series of implant regions 511 are then selectively created between every second memory stack 509 using suitable masking techniques, and a gap oxide 513 is deposited over the structure. Finally, as shown in FIG. 32, a select gate 515 is formed over the structure.

Figure 33:
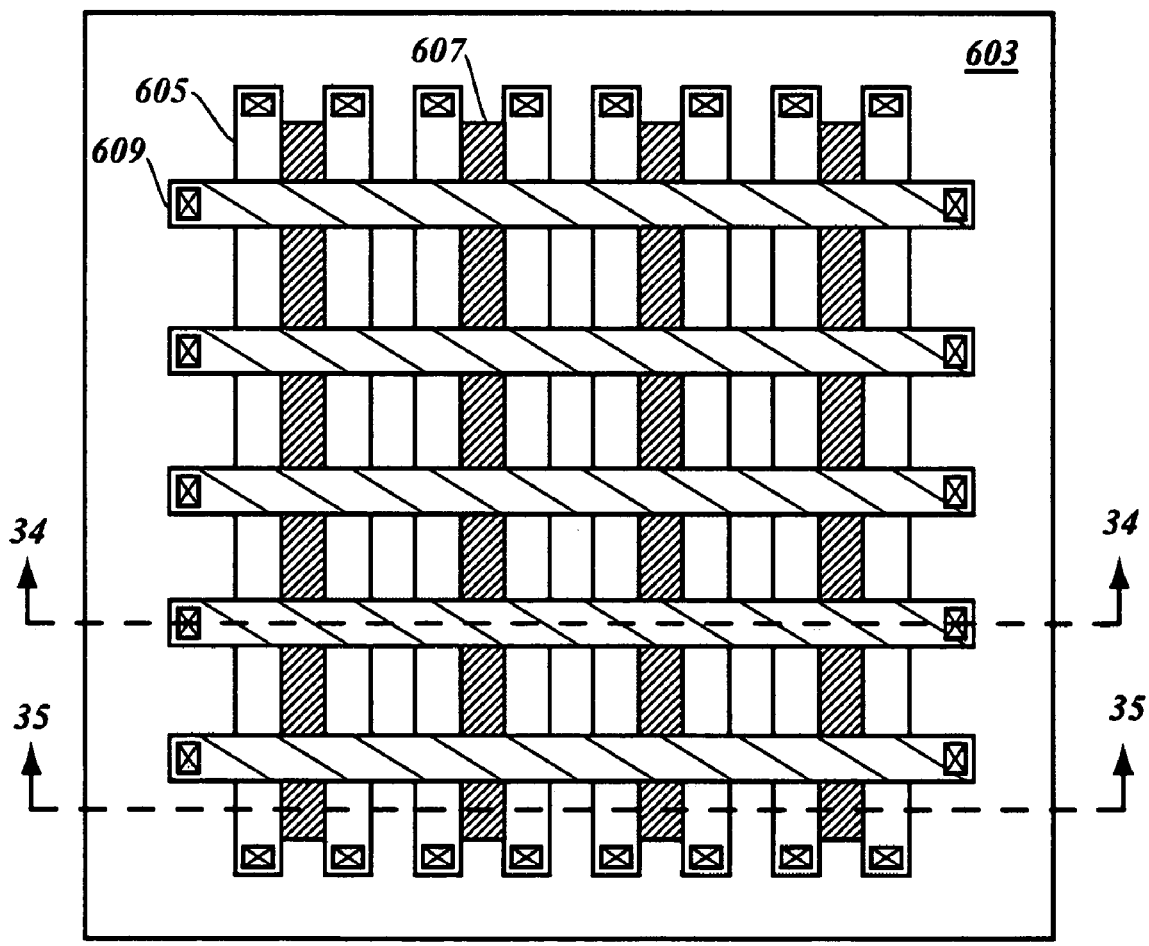
FIG. 33 is an illustration of an EEPROM memory device made in accordance with the teachings herein.
Figure 34:
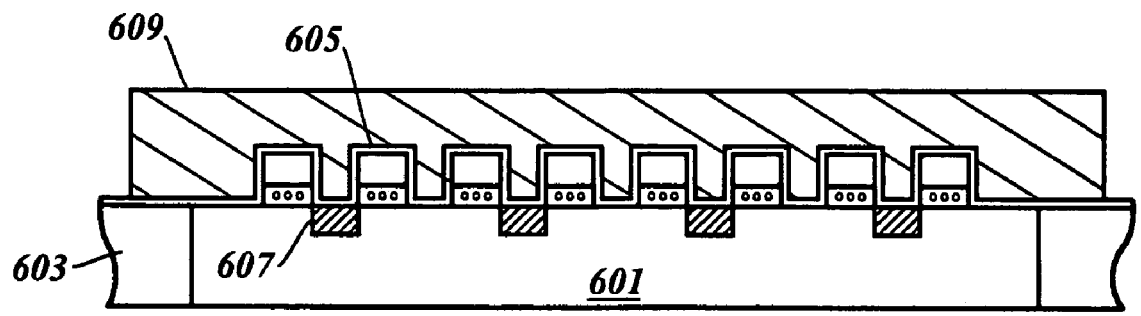
FIG. 34 is a cross-sectional view of FIG. 33 taken along LINE 34-34.
Figure 35:
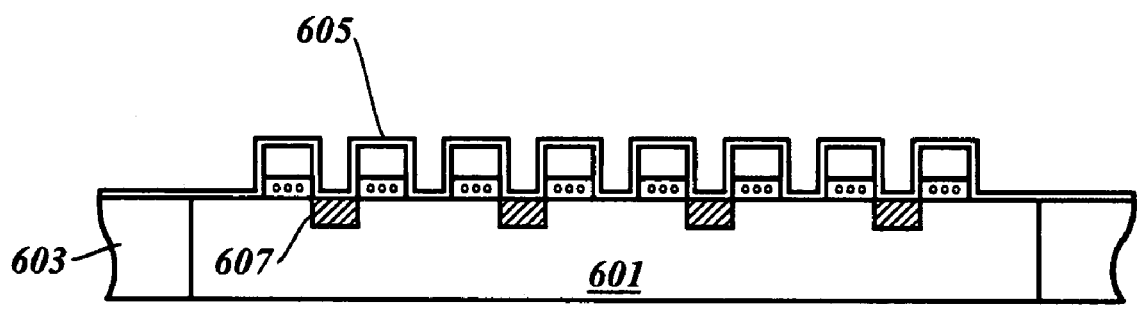
FIG. 35 is a cross-sectional view of FIG. 33 taken along LINE 35-35.

FIGS. 33-35 show a particular, non-limiting embodiment of a nonvolatile memory device 601 made in accordance with the teachings herein. The device comprises a substrate 603 on which is formed pairs of control gates 605 with implant regions 607 formed between them. A series of select gates 609 are oriented orthogonal to the control gates.

As previously noted, the fabrication processes described herein have a number of notable advantages over conventional processes used to make Virtual Ground Architecture (VGA) based flash memory (with 2 bits/cell). In particular, the methodologies described herein provide for silicidation of gate and source/drain regions. Consequently, VGA based flash memory devices made by these methodologies exhibit lower resistance than comparable devices made by conventional processes. Indeed, conventional VGA based flash memories cannot be silicided due to the absence of trench isolation regions in those devices. Consequently, in comparison to VGA based flash memory devices made in accordance with the teachings herein, conventional VGA based flash memory devices exhibit high source/drain resistance and consequently sub-optimal programming current and speed.

Furthermore, the comparatively higher series resistance in these conventional devices lowers the read current, and hence the read speed. The read speed is further limited by parasitic capacitance between the word-line and the source/drain region, a problem which is overcome in the present methodology and devices by the provision of a larger isolation between the word-line and the source/drain region. Read speed is further improved by decreased capacitance between the select gate and the source/drain region.

As an additional advantage, the source-side injection (SSI) programming that may be utilized with these devices ensures lower power operation than comparable devices which utilize Channel Hot Electron Injection (CHEI) at the drain side of the memory cell or Fowler-Nordheim Tunneling (FNT) for programming.

The devices made in accordance with the methodologies described herein have various end uses. In particular, the VGA architecture described herein enables extremely dense flash arrays. These methodologies may be used to embed such low power, highly dense flash arrays into microcontrollers for automotive and wireless use.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a nonvolatile memory device, comprising:
   providing a semiconductor substrate;
   forming first and second sets of memory stacks on the substrate, each memory stack comprising a control gate and a layer of a data storage material;
   forming an implant region in the substrate between the first and second sets of memory stacks; and
   forming a silicide layer over the implant region.

2. The method of claim 1, further comprising forming a silicide layer on the control gates of each of the memory stacks in the first and second sets of memory stacks.

3. The method of claim 1, further comprising forming a source/drain extension region between the first and second sets of memory stacks.

4. The method of claim 1, wherein each of the first and second sets of memory stacks has exactly two members.

5. The method of claim 1, wherein each of the first and second sets of memory stacks has at least two members, wherein a source/drain region is formed between the first and second sets, and wherein no source/drain region is formed between the members of the first and second sets.

6. The method of claim 1, wherein the step of forming an implant region between the first and second sets of memory stacks includes the steps of:
   forming spacer structures between the first and second sets of memory stacks;
   implanting a source/drain region between the spacer structures; and
   removing the spacer structures.

7. The method of claim 6, wherein the first set of memory stacks has at least two members, wherein the spacer structures are formed by depositing a layer of spacer material and anisotropically etching the layer of spacer material, wherein the minimum distance between the first and second sets is m, wherein the minimum distance between the members of each set is k, wherein the thickness of the spacer material as deposited is w, and wherein $\frac{1}{2}m > w > \frac{1}{2}k > 0$.

8. The method of claim 1, wherein the first set includes a first and second spaced apart memory stacks, and further comprising the step of forming a select gate which extends into the space between the first and second memory stacks.

9. The method of claim 8 wherein, prior to forming the select gate, a dielectric layer is deposited over the structure such that the dielectric layer is disposed between the first and second memory stacks and the select gate.

10. The method of claim 1, wherein each memory stack is adapted to contain two bits of data.

11. The method of claim 1, wherein the data storage material is a nanocrystal material.

12. The method of claim 1, wherein the step of forming an implant region in the substrate comprises:
    forming a set of spacer structures between the first and second sets of memory stacks which expose a portion of the substrate; and
    forming an implant region in the exposed portion of the substrate.

13. The method of claim 12, further comprising:
    forming a suicide layer between the spacer structures.

14. The method of claim 1, wherein the step of forming first and second sets of memory stacks comprises the steps of:
    forming a layer of data storage material;
    depositing a layer of gate material over the layer of data storage material; and
    masking and etching the layer of gate material and the layer of data storage material so as to define the first and second sets of memory stacks.

15. The method of claim 1, wherein the step of forming first and second sets of memory stacks comprises the steps of:
    forming a layer of data storage material;
    depositing a layer of gate material over the layer of data storage material; and
    masking and etching the layer of gate material and the layer of data storage material so as to define a trench therein which exposes a portion of the substrate;
    wherein the implant region is formed in the portion of the substrate exposed by the trench, and wherein the layer of gate material and the layer of data storage material are subsequently masked and etched to define the memory stacks in each of the first and second sets of memory stacks.

16. A method for making a non-volatile memory device, comprising:
    providing a substrate;
    forming a layer of a data storage material on the substrate;
    depositing a gate material over the layer of memory storage material;
    forming a photoresist etch mask over the gate material;
    etching the gate material and the data storage material so as to define a plurality of gates therein and to expose a portion of the substrate; and
    forming an implant region in the exposed portion of the substrate.

17. The method of claim 16, wherein the step of forming the photoresist etch mask comprises the steps of depositing and patterning a layer of photoresist.

18. A method for making a non-volatile memory device, comprising:
    providing a semiconductor substrate;
    forming a data storage layer on the substrate;
    forming a layer of gate material over the data storage layer;
    creating a Wench which extends through the layer of gate material and the data storage layer;
    forming spacer structures in the trench such that a portion of the substrate is exposed between the spacer structures; and
    creating an implant region between the spacer structures.

19. A method for making a nonvolatile memory device, comprising:
    providing a semiconductor substrate;
    forming first and second sets of memory stacks on the substrate, each memory stack comprising a control gate and a layer of a data storage material;
    forming an implant region in the substrate between the lint and second sets of memory stacks through a process comprising (a) forming spacer structures between the first and second sets of memory stacks by depositing and etching a layer of spacer material, (1,) implanting a source/drain region between the spacer structures, and (c) removing the spacer structures; and forming a suicide layer over the implant region;

wherein the minimum distance between the first and second sets is m, wherein the minimum distance between the members of each set is k. wherein the thickness of the spacer material as deposited is w, and wherein ½m>w>½k>0.

20. The method of claim 19, wherein the first set of memory stacks has at least two members.

21. The method of claim 19, wherein the spacer structures are formed by anisotropically etching the layer of spacer material.

22. The method of claim 1, wherein the layer of data storage material is in contact with the substrate.

23. A method for making a nonvolatile memory device, comprising:

providing a semiconductor substrate;

forming first and second sets of memory stacks on the substrate, each memory stack comprising a control gate and a layer of a data storage material, wherein the first and second memory stacks are formed through a process comprising (a) forming a layer of data storage material, (b) depositing a layer of gate material over the layer of data storage material, and (c) masking and etching the layer of gate material and the layer of data storage material so as to define a wench therein which exposes a portion of the substrate;

forming an implant region in the substrate between the first and second sets of memory stacks; and forming a suicide layer over the implant region.

24. The method of claim 23, wherein the implant region is formed in the portion of the substrate exposed by the trench, and wherein the layer of gate material and the layer of data storage material are subsequently masked and etched to define the memory stacks in each of the first and second sets of memory stacks.

* * * * *

UNITED STATES PATENT AND TRADEMARK OFFICE
CERTIFICATE OF CORRECTION

| | | |
|---|---|---|
| PATENT NO. | : 7,491,600 B2 | |
| APPLICATION NO. | : 11/267442 | |
| DATED | : February 17, 2009 | |
| INVENTOR(S) | : Erwin J. Prinz, Gowrishankar L. Chindalore and Paul A. Ingersoll | |

It is certified that error appears in the above-identified patent and that said Letters Patent is hereby corrected as shown below:

In the Claims:

Column 12, line 52, please change "creating a Wench which" to be -- creating a trench which --

Signed and Sealed this
Twentieth Day of August, 2013

Teresa Stanek Rea
*Acting Director of the United States Patent and Trademark Office*